United States Patent [19]

Kawaji et al.

[11] Patent Number: 4,935,698
[45] Date of Patent: Jun. 19, 1990

[54] SENSOR HAVING DUAL HALL IC, POLE PIECE AND MAGNET

[75] Inventors: Hideki Kawaji, Andover; Peter J. Gilbert, Henniker, both of N.H.

[73] Assignee: Sprague Electric Company, North Adams, Mass.

[21] Appl. No.: 318,265

[22] Filed: Mar. 3, 1989

[51] Int. Cl.⁵ .................... G01B 7/14; H01L 43/06
[52] U.S. Cl. ................... 324/207.20; 324/235; 324/117 H; 338/32 H
[58] Field of Search ............. 324/207, 208, 233–236, 324/225, 228, 251, 252, 262, 117 H; 338/32 R, 32 H; 307/309; 328/5; 360/112, 113

[56] References Cited

U.S. PATENT DOCUMENTS

| | | | |
|---|---|---|---|
| 3,197,880 | 8/1965 | Rice et al. | 324/251 X |
| 4,296,410 | 10/1981 | Higgs et al. | 324/251 X |
| 4,349,814 | 9/1982 | Akehurst | 324/251 X |
| 4,518,918 | 5/1985 | Avery | 324/208 |
| 4,587,486 | 5/1986 | Soyck | 324/236 |
| 4,612,502 | 9/1986 | Spies | 324/208 |
| 4,691,185 | 9/1987 | Loubier et al. | 324/251 X |
| 4,692,702 | 9/1987 | Huschelrath et al. | 324/235 X |
| 4,761,569 | 6/1988 | Higgs | 324/251 X |

FOREIGN PATENT DOCUMENTS 168382 9/1884 Japan.

Primary Examiner—Reinhard J. Eisenzopf
Assistant Examiner—Warren S. Edmonds

[57] ABSTRACT

A Hall elements and magnet assembly for use as a proximity detector includes a magnet, a pole piece mounted to one pole end of the magnet and an integrated circuit having two side-by-side Hall elements, an amplifier, interconnecting wiring providing the difference voltage between the two Hall output voltages at the input of the amplifier, and a Schmitt trigger circuit. The integrated circuit is mounted to the pole piece at the pole end of the magnet. The pole piece is a ferromagnetic member which is thinner in the center than at the periphery for achieving a highly uniform field strength across the surface of the magnet pole end toward reducing the criticality of the position of mounting of the integrated circuit in manufacturing and for extending the range of gap dimensions between a passing ferromagnetic article and the assembly for which proper detection of the passing article can be made to occur. The term "ferromagnetic" as used herein means any material with a relative permeability greater than unity and preferably greater than 100.

5 Claims, 3 Drawing Sheets

FIG.12
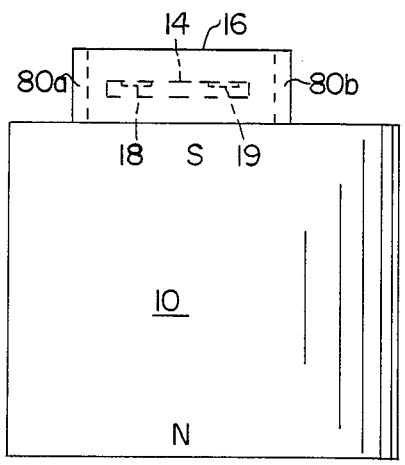
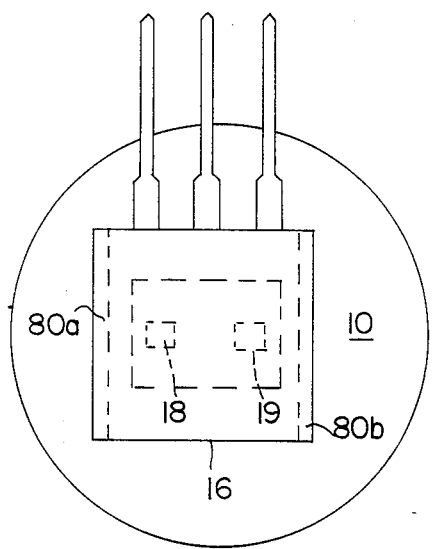
FIG.13

SENSOR HAVING DUAL HALL IC, POLE PIECE AND MAGNET

BACKGROUND OF THE INVENTION

This invention relates to a detector of passing ferromagnetic articles such as gear teeth, the detector being made up of a pair of Hall devices differentially connected and assembled at a pole end of a magnet, and more particularly pertains to such a detector having interposed, between the magnet and Hall devices, a ferromagnetic pole piece that is thinner at the center than at the periphery for providing a uniform magnetic field.

It is known to use two differentially connected Hall elements mounted at a pole end of a magnet as a ferromagnetic article proximity detector. In the patent U.S. Pat. No. 4,518,918 to G. Avery, issued May 21, 1985 and assigned to the same assignee as is the present invention, such a detector is employed as a gear tooth sensor wherein two separate Hall devices are mounted directly to the magnet pole end and spaced apart a distance equally about half the pitch of the gear teeth. In a related sensor assembly of a magnet and a plurality of magneto resistors, a ferromagnetic plate is interposed between the resistors and the magnet so that the resistors are in a more uniform field.

In a patent by J. K. Higgs and B. L. Gibson, U.S. Pat. No. 4,859,941 issued Aug. 22, 1989 and assigned to the same assignee as is the present invention, there is described an assembly of a magnet, a pole piece and dual Hall IC. The pole piece has extensions that turn downward alongside the magnet to improve the uniformity of the field across the magnet pole and to increase the working range of gap dimensions between the assembly and a rotating ferromagnetic gear, the teeth of which are to be detected by the assembly.

It is an object of this invention to provide in such a ferromagnetic-article proximity sensor an even more uniform pole end field and further to provide an improved tolerance for large gaps between the dual Hall sensor and a passing ferromagnetic article to be detected.

SUMMARY OF THE INVENTION

A dual Hall device and magnet assembly for detecting passing ferromagnetic objects, e.g. gear teeth, includes a magnet and a ferromagnetic pole piece mounted to one pole end of the magnet. An integrated circuit die has a pair of Hall elements formed in a face of the die and the die is fixedly mounted at the one pole end with the die face about parallel with the one pole end. The pole piece in this invention has a center portion that is thinner in a magnet-axis direction away from the magnet than is the thickness of the remaining peripheral portion of the pole piece taken in the same direction and as measured away from the plane of the one magnet pole-end.

All else remaining the same, the pole piece of this invention provides a greater improvement in uniformity in the axially directed magnetic field strength across a pole end of the magnet than for any known pole pieces of the prior art.

This invention recognizes that even a small improvement in pole-end field uniformity is not only valuable in the manufacture of the assembly (because the mounting of the IC on the pole-end is much less critical) but is valuable in the use of the assembly because the magnitude of the differential Hall elements' output voltage attributable to a changing gap between a ferromagnetic article and the sensor assembly when the article is moving along a line coincident with the axis of the assembly magnet (e.g. the article is a rotating eccentric gear), is directly proportional to the unbalance between the field strengths at the one and the other of the two Hall sensors when there is no ferromagnetic article nearby. This observation adds greatly to the incentive to make the pole-end field as uniform as possible because, it now becomes apparent that in the limit, were the pole-end field to be made absolutely uniform, the maximum gap between the sensor assembly and a rotating gear at which proper sensing of the gear teeth would be possible would now only depend upon the strength of that uniform field and the gain of the Hall voltage amplifier.

BRIEF DESCRIPTION OF THE DRAWINGS

FIG. 12 shows in side view a seventh preferred embodiment having a pole piece made up of a peripheral portion 80a and another peripheral portion 80b both of which are incorporated in the package 16.

FIG. 13 shows in top view the embodiment of FIG. 12.

DESCRIPTION OF THE PREFERRED EMBODIMENTS

The magnet 10 employed in the preferred embodiments of FIGS. 1, 6, 8, 10 and 11 is a cylindrical neodymium iron boron magnet with squared-off flat pole ends and having a length of 200 mils (5 mm) and an outside diameter of 320 mils (8 mm). The axial field strength of the magnet 10 is about 3000 to 4000 gauss but any magnet, preferably a strong one is workable. The field at each pole end varies raggedly from point to point at the pole end surface and additionally tends to exhibit a strongest field at the center diminishing toward the periphery.

Figure 4:
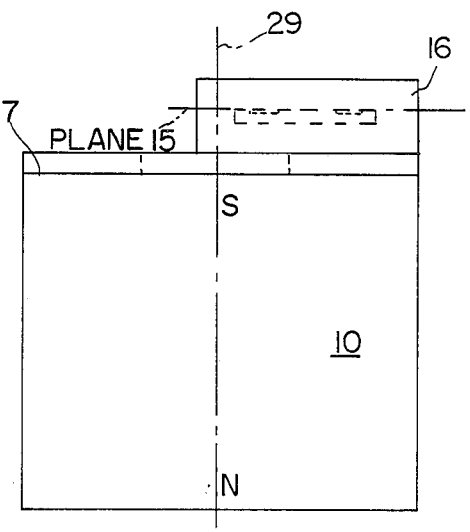
FIG. 4 shows a modified first embodiment having the same parts as shown in FIG. 1 except the integrated circuit package 16 is positioned flush with the right side rather than the left side of the magnet 10.

The dual-Hall integrated circuit (IC) 14 includes two essentially identical Hall elements 18 and 19 lying centered about a line 20 (FIG. 2) in a plane 15 (FIG. 4) that is parallel to the surface (17) of the magnet pole end. A standard molded resin package 16 that encapsulates the IC 14 has a thickness of 80 mils (2 mm) and includes three metal leads 21a, 22a and 23a that extend radially from package 16. Leads 21a, 22a and 23a are connected respectively to the three IC terminals 21, 22 and 23 as seen in FIG. 3. In the IC 14, the outputs of the two Hall elements 18 and 19 are differentially connected to the input of a differential amplifier 25. The output of the amplifier 25 is connected to the input of a Schmitt trigger circuit 27 having an output connected to the IC output terminal 23. The package 16 is 180 mils (4.6 mm) wide as shown. The Hall elements 18 and 19 are spaced apart center-to-center by 88 mils (2.24 mm). The vertical scale of the package 16 is magnified to better show the encapsulated Hall IC.

Figure 1:
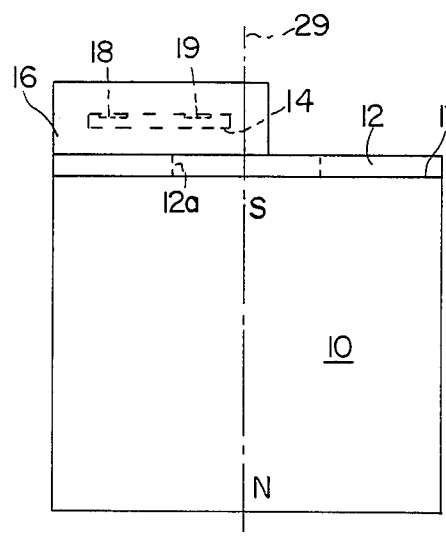
FIG. 1 shows in side view a first preferred embodiment having magnet 10 with a ferromagnetic ring-shaped pole piece 12 with a hole 12a mounted to a south pole end of the magnet 10 and an integrated circuit 14 in a molded resin package 16 mounted to the pole piece 12. Two Hall elements 18 and 19 are formed in the upper major face of the integrated circuit 14.

In a series of three experiments, the package 16 was moved to the right in increments of 20 mils from the position (0 mils) it occupies relative to magnet 10 as shown in FIG. 1. The Hall elements 18 and 19 remain in a plane 24 (FIG. 2) in which lies the axis 29 of the magnet 10. The package 16 was modified to connect to the output of amplifier 25 so that the amplified Hall voltage could be measured at each increment of movement of the package 16.

Figure 7:
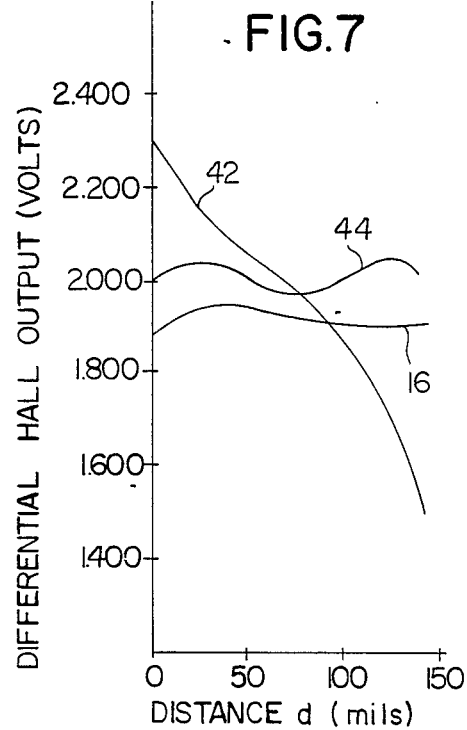
FIG. 7 shows a graph of the differential output voltage of the two differentially connected Hall devices 18 and 19 with no pole piece (curve 42), with the pole piece 12 of FIGS. 1 and 2 (curve 44) and with the pole piece 30, all as a function of the position of the integrated circuit package 16 along the Hall elements center line on the south pole end of the magnet 10.
Figure 9:
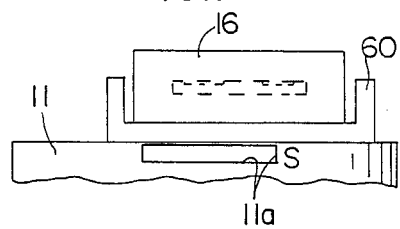
FIG. 9 shows in side view a fourth preferred embodiment having a U-shaped pole piece 60 and a slot 11a in a central region of the magnet pole end.
Figure 10:
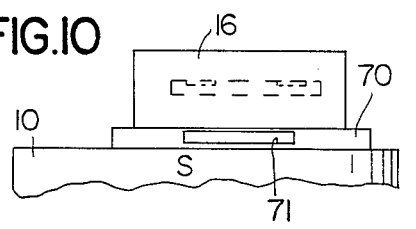
FIG. 10 shows in side view a fifth preferred embodiment having a plate pole piece 70 with a groove 71 to thin a central region of the pole piece 70.
Figure 11:
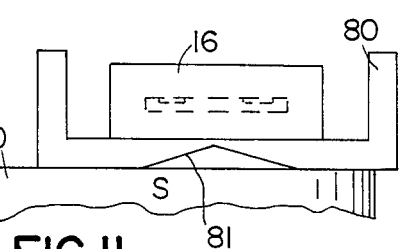
FIG. 11 shows in side view a sixth preferred embodiment having a U-shaped pole piece 80 and a V-shaped groove 81 in a central region thereof.

In the first experiment the pole piece 12 was removed and the package 16 moved along the pole-end surface of magnet 10. The Hall output voltage was plotted as curve 42 in FIG. 7 which curve is quite steep indicating the large axial-field gradient in the base-magnet pole end, reflecting the diminishing field strength from its high point at the center, namely at the magnet axis 29.

In the second experiment the washer-shaped iron pole piece 12 shown in FIGS. 1, 2, 4 and 5 was mounted to the magnet pole end, and the package 16 moved as before across the pole end but along the surface of the pole piece 12 as shown. The Hall output voltage is plotted as 44 in FIG. 7, and reflects a much more stable axial-field gradient.

Figure 6:
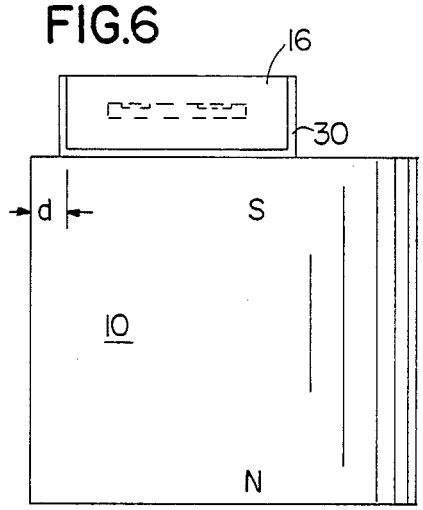
FIG. 6 shows a second preferred embodiment having a magnet 10, an integrated circuit package 16 and a U-shaped pole piece 30 conforming to the package 16 that is spaced away from the south pole end of the magnet by the plate portion 16a of the pole piece 16.
Figure 8:
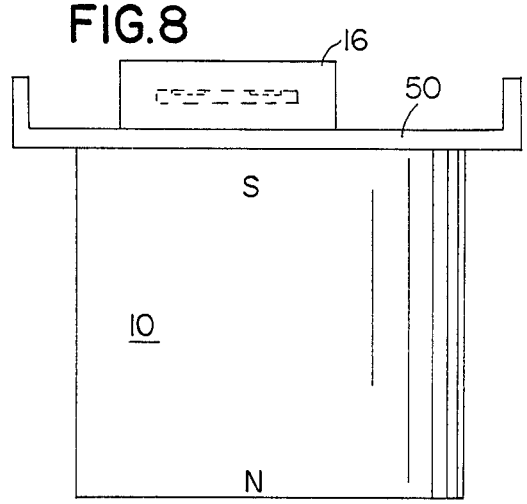
FIG. 8 shows in side view a third preferred embodiment having a U-shaped pole piece 50 mounted symmetrically with the magnet 10.

In the third experiment another pole piece 30 having a U-shape is fitted to the package 16 as shown in FIG. 6, and the pole piece 30 moves with the package 16 across the pole end of the magnet 10. The Hall output voltage is plotted as curve 46 in FIG. 7 and indicates an even greater improvement from the point of view of reducing the criticality of positioning and permanently mounting the package 16 to the magnet pole end toward obtaining a higher yield and lower cost Hall IC and magnet assemblies in production.

Numerous pole piece configurations were tried and it is concluded that the geometry of these pieces is not critical so long as the periphery of the pole piece is thicker at the pole-piece periphery at or near the magnet-axis plane 24. For those pole pieces, e.g. 30, which achieve greater peripheral thickness by having been perpendicularly bent up or otherwise extended up in a magnet-axis direction away from the magnet, the field smoothing effect tends to be better yet.

Figure 2:
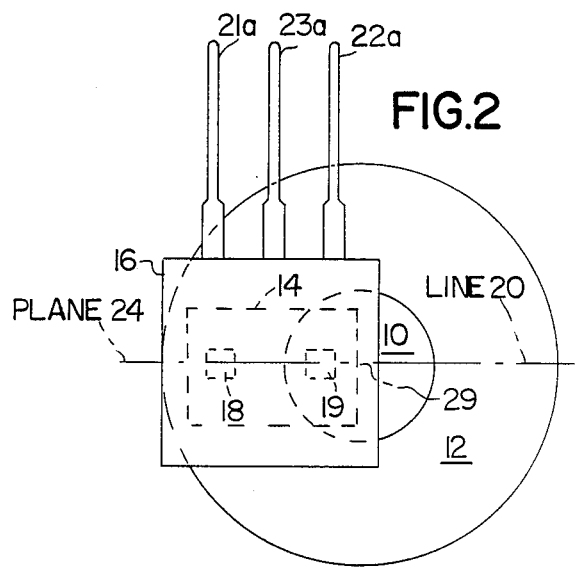
FIG. 2 shows in top view the assembly of FIG. 1.
Figure 5:
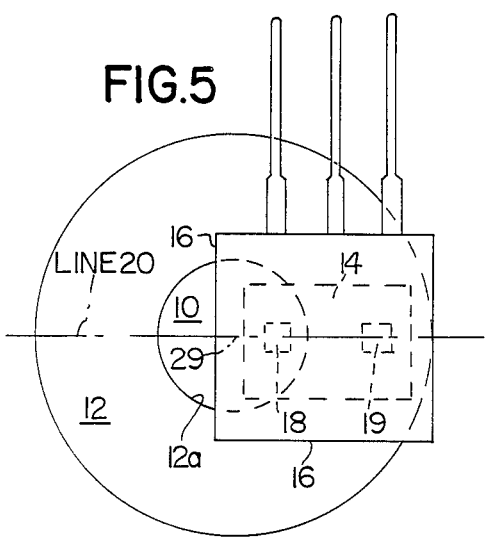
FIG. 5 shows in top view the assembly of FIG. 4.
Figure 3:
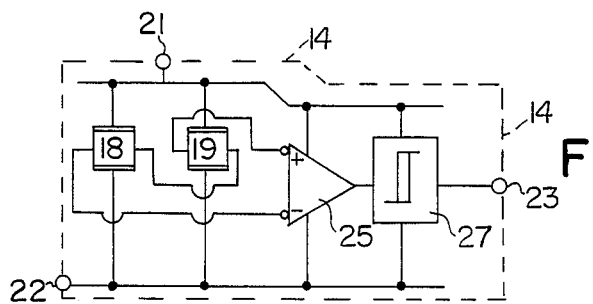
FIG. 3 shows a circuit diagram of the integrated circuit 14 of FIG. 1.

The additional embodiments of this invention illustrated in FIGS. 8, 9, 10, 11 and 12 as well as those of FIGS. 1 and 2 follow the presciption that the pole piece is thinner at the center thereof than at the periphery and that the thicker peripheral portion extends away from the magnet pole-end.

The embodiment illustrated in FIGS. 12 and 13 is a special limiting case wherein the thickness of the thinner central portion of the pole piece 80 is zero. The peripheral pole-piece portions 80a and 80b serve, as do the outward-extending peripheral portions of the previously considered pole pieces, to channel away some of the magnetic field flux from the peak flux region at the center of the magnet to render the magnetic field more uniformly strong across the pole-end portion of the magnet over which the dual Hall IC is mounted. It may be that this periphery-only pole piece 80 will be more effective in doing so when combined with a magnet with a hole or slot in the center of the pole end such as magnet 11 shown in FIG. 9.

From experience it has become increasingly evident that the use of any pole piece that improves uniformity of the axially directed magnetic field at a magnet pole end, will also tend to increase the maximum gap between sensor and rotating gear at which gear teeth are properly detected.

This might be explained by the following considerations:

If an eccentric rotating gear were used that had no teeth, the differential output voltage from the two Hall elements would have a sinusoidal waveform of frequency equal to the rpm of the gear (cam). Now if, by use of a pole piece or by any other means, the axial field in the plane of the Hall elements were reduced to zero while the gear (cam) was in any stopped position, then when the gear (cam) is again rotated the sinusoidal Hall output voltage would be expected to have disappeared. This is believed to be so because even though the field strength rises and falls as the gap between eccentric gear (cam) and the Hall elements increases and decreases, the symmetry about the axis of the magnet of the magnetic field lines always produces the same field strength at the two Hall devices.

However, returning to a more realistic situation, there will always be some non-uniformity in the magnet field, and to the degree that this is so there will be a proportionally large differential Hall voltage of sinusoidal waveform and a gear (cam) rotation frequency.

Now if the average gap is progressively increased between such a realistic dual-Hall-IC-plus-magnet assembly and a rotating eccentric gear with teeth, the maximum average gap at which the teeth are sometimes not properly detected is a function of the sum of a gear-rotation-frequency voltage and a gear-tooth-frequency voltage, so that the former is modulated by the later. The amplitudes of each of these two superimposed signals at the input of Schmitt trigger circuit is directly proportional to magnet strength and amplifier gain so that varying either will not increase the above-noted maximum average gap. However, if the field uniformity is reduced by same means, then the amplifier gain may be increased to effect an increase in the peak average gap. In the limit, if a perfectly uniform field were realized, the average gap that can be achieved is only limited by how strong a magnet field will be provided and/or how high an amplifier gain will be provided. The more uniform pole-end field strength provided in the assembly of this invention, therefore, leads to lower manufacturing costs and better performance.

What is claimed is:

1. In a sensor of the kind including a magnet, a ferromagnetic pole piece mounted to one pole end of said magnet, an integrated circuit die having a pair of Hall elements formed side by side in a face of said die and lying centered about a line in said die face, said die being mounted to said pole piece with said die face about parallel with said pole end, the improvement comprising:

said pole piece having a center portion that, taken in a magnet-axis direction, is thinner going away from said one pole end than is the remaining peripheral portion of said pole piece to divert a portion of the magnetic from the center of said pole end toward the periphery of said pole end and to render the field more uniform along said center line.

2. A dual Hall sensor comprising:
(a) a semiconductor integrated circuit die having two Hall elements formed side by side in a face of said die and lying centered about a line in said die face;
(b) a magnet having one flat pole end lying in one plane;
(c) a ferromagnetic pole piece having a plate portion with one major surface lying in said plane mounted against said one pole end of said magnet and said integrated circuit die being mounted to the opposite major surface of said plate portion with said die face substantially parallel with said one pole-end plane, said pole piece having a center region that is thinner taken in the direction away from said pole-end plane than are the peripheral regions of said pole piece near said line to divert a portion of the magnetic field from the center of said pole end toward the periphery of said pole end and to render the field more uniform along said center line; and (d) a differential connection means connected to the outputs of said Hall elements for providing a differential output voltage that is a function of the difference between the strength of the magnetic field at said one and at the other of said Hall elements, respectively, which field is normal to said major die surface.

3. The sensor of claim 2 wherein said center pole-piece region is a plate portion to which said die is mounted and said peripheral region extends away from said magnet in a magnet-axis direction.

4. The sensor of claim 2 wherein said peripheral pole-piece region has the annular shape of a washer and said center region is a hole.

5. The sensor of claim 2 wherein said center region is a plate portion to which said die is bonded and said pheripheral region is a turned up extension of said plate portion extending away from said magnet in a magnet-axis direction.

* * * * *